United States Patent [19]
Duesman

[11] Patent Number: 5,740,111
[45] Date of Patent: Apr. 14, 1998

[54] CHARGE PUMP DISABLEMENT APPARATUS

[75] Inventor: Kevin Duesman, Boise, Id.

[73] Assignee: Micron Technology, Inc., Boise, Id.

[21] Appl. No.: 590,935

[22] Filed: Jan. 24, 1996

[51] Int. Cl.$^6$ .................................................. G11C 7/00
[52] U.S. Cl. ........................................ 365/189.09; 365/226
[58] Field of Search .............................. 365/189.09, 226, 365/185.18, 185.27; 327/536

[56] References Cited

U.S. PATENT DOCUMENTS

| 4,638,464 | 1/1987 | Cranford, Jr. et al. | 365/226 |
| 5,313,429 | 5/1994 | Chevallier et al. | 365/226 |

Primary Examiner—Joseph A. Popek
Attorney, Agent, or Firm—Fletcher & Associates

[57] ABSTRACT

Apparatus is disclosed for disabling the charge pumps in an integrated circuit memory when data is being read from the memory.

6 Claims, 1 Drawing Sheet

CHARGE PUMP DISABLEMENT APPARATUS

BACKGROUND OF THE INVENTION

1. Field of the Invention

The present invention relates to integrated circuit memories, and, more particularly to method and apparatus for disabling charge pumps in such memories.

2. Description of the Prior Art

Integrated circuit memories, e.g., dynamic random access memories ("DRAMs"), include a memory array having a plurality of memory cells that are arranged in a matrix of intersecting rows and columns. In a DRAM, for example, each memory cell stores a binary digit ("bit") of information, whose logic state is determined by the presence or absence of charge across a capacitor which is part of the memory cell. The capacitance of the memory cell capacitor is very small and hence the charge that can be stored in a memory cell capacitor is signal.

A particular memory cell in the memory array is accessed by providing the memory with a plurality of binary address signals corresponding to the address of that cell. Typically, these address signals include row address signals and column address signals, which are decoded by circuitry in the integrated circuit memory to select the particular row and column in the memory array containing the selected memory cell.

Each memory cell also includes a transistor which is rendered conductive upon selection of the cell at which time the memory cell capacitor is coupled to a digit line. Each digit line is precharged to a predetermined voltage before the memory cell is selected. Since the capacitance of a digit line in a DRAM is usually at least an order of magnitude greater than the capacitance of the memory cell, a very small change in the precharged voltage on a digit line occurs as a result of the digit line being coupled to the capacitor of a selected memory cell. This small change in voltage is sensed by a sense amplifier which is connected to the digit line. As its name implies, the sense amplifier functions to sense the small changes in voltage on a digit line that occur as a result of selecting a memory cell and to amplify those changes to a full logic signal.

In DRAMs, certain voltages are generated internally for use by the DRAMs. One such voltage is the substrate bias voltage which is commonly designated $V_{BB}$ and which is a negative voltage on the order, for example, of −1.5 volts. This voltage $V_{BB}$ helps to keep the threshold voltage $V_T$ of the transistors in the memory constant. Another voltage which is generated internally on a DRAM is the elevated voltage, which is commonly designated $V_{CCP}$. This voltage typically has a magnitude which is higher than the supply voltage $V_{CC}$. In a DRAM in which $V_{CC}$ is +3.5 volts, $V_{CCP}$ may for example be +5 volts. $V_{CCP}$ is used to drive the word (row) lines in a DRAM, so that a full cell voltage is connected to the digit line when a memory cell is addressed.

Each voltage $V_{BB}$ and $V_{CCP}$ is generated by circuitry known as a charge pump. When either voltage drops below a predetermined level, its charge pump is activated to boost the voltage level. Since the circuitry in these charge pumps commonly includes ring oscillators, the charge pump tends to produce noise when it is operating. This noise may affect the voltage on the digit lines of the memory and hence cause erroneous data to be sensed by the sense amplifiers.

SUMMARY OF THE INVENTION

In accordance with the present invention, apparatus is provided which functions to disable the operation of charge pumps in an integrated circuit memory during the reading of data from a selected memory cell. Preferably, the disablement of the charge pump occurs between the time of row selection and the time that the sense amplifier is enabled to sense the data on the digit line.

DESCRIPTION OF SPECIFIC EMBODIMENTS

It will be appreciated that the present invention can take many forms and embodiments. Some embodiments of the invention are described to give an understanding of the invention. It is not intended that these limited embodiments should affect the scope of the invention.

Figure 1:
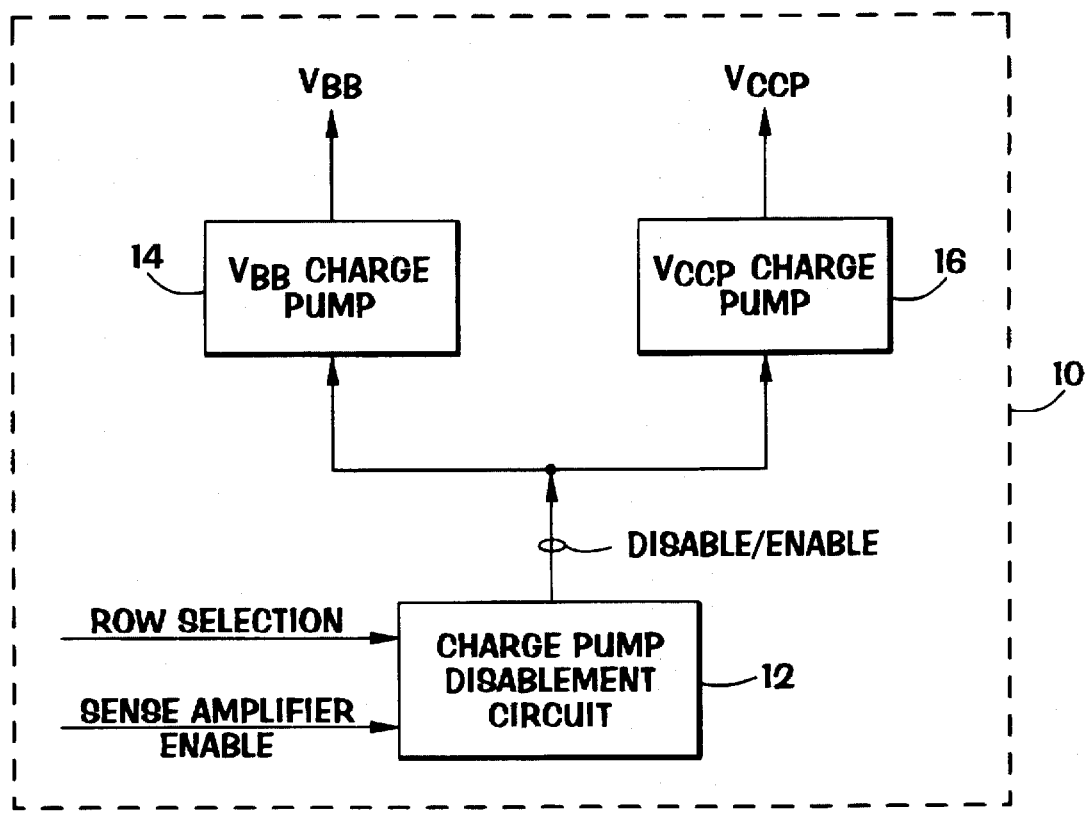
FIG. 1 is a schematic diagram in block diagram form of a embodiment of the present invention.

With reference to FIG. 1, an integrated circuit memory 10 in accordance with the present invention includes charge pump disablement circuit 12, $V_{BB}$ charge pump 14, and $V_{CCP}$ charge pump 16. $V_{BB}$ charge pump 14 generates the back biasing voltage for the substrate of the integrated circuit memory 10 and may, for example, produce a voltage of −1.5 volts at its output, $V_{BB}$. $V_{CCP}$ charge pump 16 generates an elevated voltage at its output, $V_{CCP}$, which may for example be used to drive the row lines of the integrated circuit memory 10. Appropriate designs for $V_{BB}$ charge pump 14 and $V_{CCP}$ charge pump 16 are well-known in the pertinent art and will not be further discussed.

Charge pump disablement circuit 12 functions to disable the operation of $V_{BB}$ charge pump 14 and $V_{CCP}$ charge pump 16 so that they will not disturb the reading of data from the selected memory cell. In due embodiment, one of the inputs to charge pump disablement circuit 12 is a row selection signal, which is active at or near the time that a row in the integrated circuit memory 10 has been selected. The beginning of the active state of row selection signal thus approximately corresponds to the time that the selected memory cell transistor in the memory 10 is enabled. In response to the active state of this row selection signal, the disable output of charge pump disablement circuit 12 is activated to disable the operation of $V_{BB}$ charge pump 14 and $V_{CCP}$ charge pump 16.

In this embodiment, another input to charge pump disablement circuit 12 is the sense amplifier enable signal, which is activated at or near the time that the sense amplifiers in the memory 10 begin the sensing operation. In response to the sense amplifier enable signal, the disable output of charge pump disablement circuit 12 returns to its non-active state, thereby enabling the operation of $V_{BB}$ charge pump 12 and $V_{CCP}$ charge pump 16.

Figure 2:
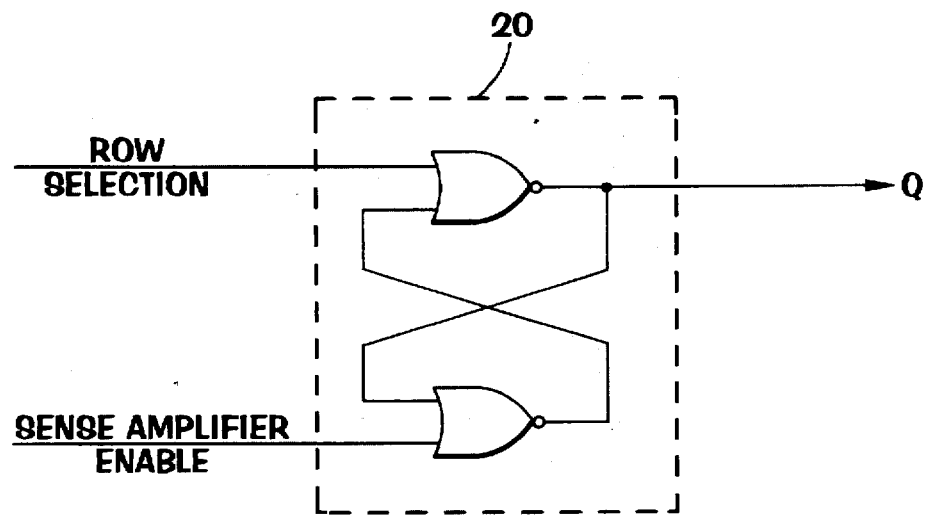
FIG. 2 is a schematic diagram of one embodiment of apparatus in accordance with the present invention.

Those skilled in the art will recognize with the benefit of this specification that charge pump disablement circuit 12 may be implemented in a variety of ways. For example, as shown in FIG. 2, charge pump disablement circuit 12 may comprise R-S latch 20. R-S latch 20 may be set when the row selection signal occurs and reset by the sense amplifier enable signal. In this embodiment of charge pump disablement circuit 12, $V_{BB}$ charge pump 14 and $V_{CCD}$ charge pump 16 are disabled while the output Q of R-S latch 20 is a logic 0.

What is claimed is:

1. In an integrated circuit memory for controlling operation of a charge pump, said memory having an array of memory cells and having a sense amplifier coupled to said array of memory cells, said array of memory cells being arranged in rows and columns, and said memory generating a row selection signal to select a row of memory cells and generating a sense amplifier enable signal to activate said sense amplifier, the improvement comprising:

circuitry responsive to the row selection signal for disabling the operation of said charge pump and responsive to the sense amplifier enable signal for enabling the operation of said charge pump.

2. The memory of claim 1, wherein said circuitry comprises a latch which is set by the row selection signal and reset by the sense amplifier enable signal.

3. A charge pump apparatus for use with an integrated circuit memory, said memory generating a row selection signal to select a row of cells within a memory array of said memory, and said memory generating a sense amplifier enable signal to activate a sense amplifier coupled to said memory array, said apparatus comprising:

a charge pump for generating a voltage having a magnitude that differs from a magnitude of a supply voltage used by said memory; and a charge pump control circuit being coupled to said charge pump, said charge pump control circuit disabling said charge pump in response to receiving said row selection signal and enabling said charge pump in response to receiving said sense amplifier enable signal.

4. The charge pump apparatus of claim 3, wherein said charge pump control circuit comprises:

a latch having a set input and a reset input, said set input being coupled to receive said row selection signal and said reset input being coupled to receive said sense amplifier enable signal, said latch having an output coupled to said charge pump, said output delivering a disable signal to said charge pump in response to said set input receiving said row selection signal and delivering an enable signal to said charge pump in response to said reset input receiving said sense amplifier enable signal.

5. A charge pump apparatus for use with an integrated circuit memory, said memory generating a row selection signal to select a row of cells within a memory array of said memory, and said memory generating a sense amplifier enable signal to activate a sense amplifier coupled to said memory array, said apparatus comprising:

a first charge pump for generating a voltage having a magnitude that is lower than a magnitude of a supply voltage used by said memory;

a second charge pump for generating a voltage having a magnitude that is higher than a magnitude of said supply voltage; and a charge pump control circuit being coupled to said first charge pump and said second charge pump, said charge pump control circuit disabling said first charge pump and said second charge pump in response to receiving said row selection signal and enabling said first charge pump and said second pump in response to receiving said sense amplifier enable signal.

6. The charge pump apparatus of claim 5, wherein said charge pump control circuit comprises:

a latch having a set input and a reset input, said set input being coupled to receive said row selection signal and said reset input being coupled to receive said sense amplifier enable signal, said latch having an output coupled to said first charge pump and said second charge pump, said output delivering a disable signal to said first charge pump and said second charge pump in response to said set input receiving said row selection signal and delivering an enable signal to said first charge pump and said second charge pump in response to said reset input receiving said sense amplifier enable signal.

\* \* \* \* \*